United States Patent
Satoh et al.

(10) Patent No.: US 6,252,798 B1
(45) Date of Patent: Jun. 26, 2001

(54) NONVOLATILE SEMICONDUCTOR MEMORY DEVICE CAPABLE OF CONTROLLING MUTUAL TIMING OF WRITE VOLTAGE PULSE AND TRANSFER VOLTAGE PULSE

(75) Inventors: Shinji Satoh; Riichiro Shirota, both of Fujisawa; Toru Tanzawa, Ebina, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/104,163

(22) Filed: Jun. 25, 1998

(30) Foreign Application Priority Data

Jun. 27, 1997 (JP) .................................... 9-172251

(51) Int. Cl.$^7$ .................................................. G11C 16/32
(52) U.S. Cl. ............................. 365/185.02; 365/185.17; 365/185.19; 365/185.23
(58) Field of Search ................... 365/185.17, 185.02, 365/185.19, 185.23

(56) References Cited

U.S. PATENT DOCUMENTS 5,568,420 * 10/1996 Lim et al. .................... 365/185.17
5,617,353 * 4/1997 Lim et al. .................... 365/185.17
5,621,684 * 4/1997 Jung ............................. 365/185.17
5,661,682 * 8/1997 Lim et al. .................... 365/185.17
5,677,873 * 10/1997 Choi et al. ................... 365/185.17

* cited by examiner

Primary Examiner—Andrew Q. Tran
(74) Attorney, Agent, or Firm—Hogan & Hartson, LLP

(57) ABSTRACT

A nonvolatile semiconductor memory device comprises a memory cell array having plural electrically erasable memory cells including a gate, a source, a drain, and an electric charge accumulation layer each disposed in a matrix form. A data writing section writes data into memory cells in this memory cell array. A data reading section reads out data in memory cells of the memory cell array. A data erasing section erases data in memory cells of the memory cell array. A control section controls, when applying a first signal to the gate in a specified memory inhibited of writing and applying a second signal to a node capacitively coupled to at least one of source and drain, in writing data into the memory cells, so that the second signal may fall later than the first signal.

10 Claims, 13 Drawing Sheets

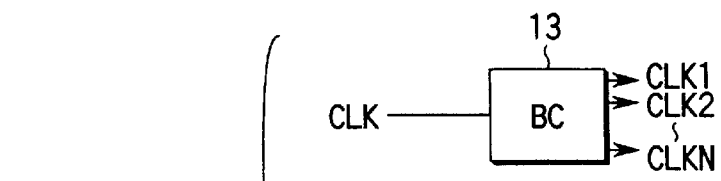
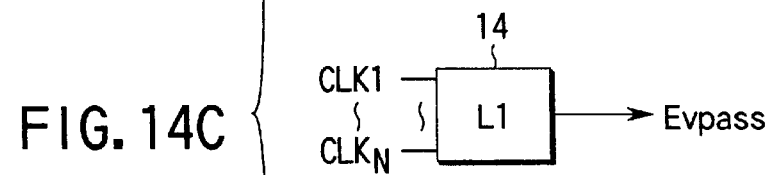

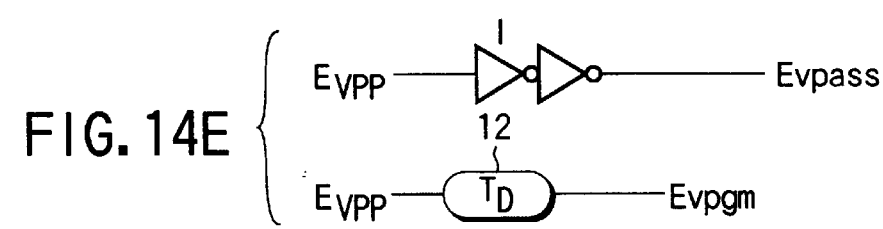

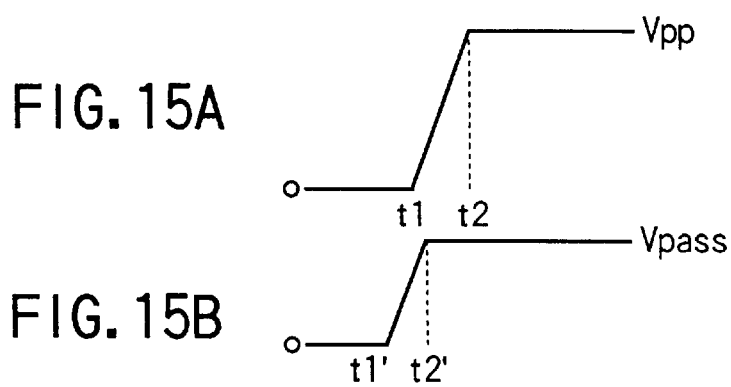
FIG. 15A
FIG. 15B
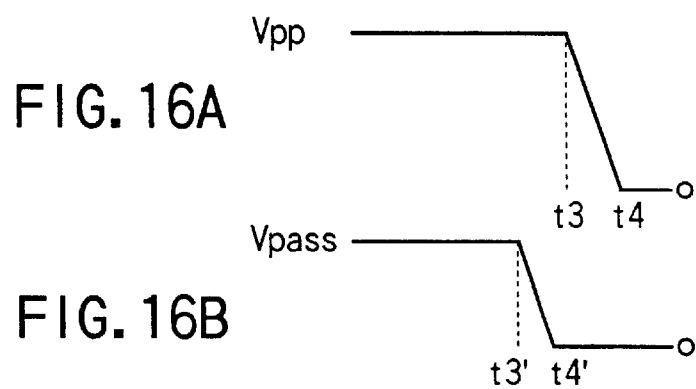
FIG. 16A
FIG. 16B
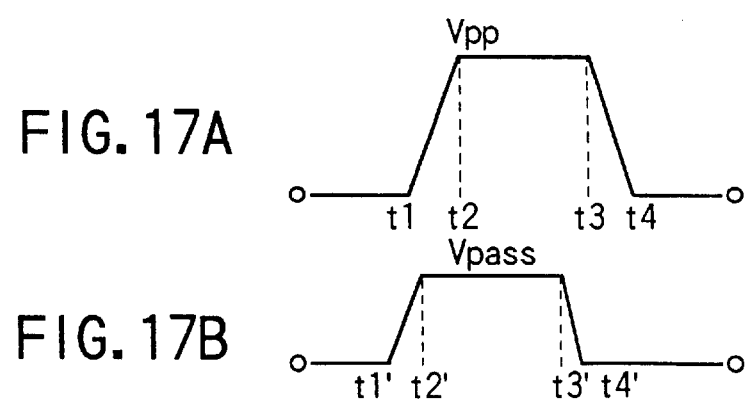
FIG. 17A
FIG. 17B
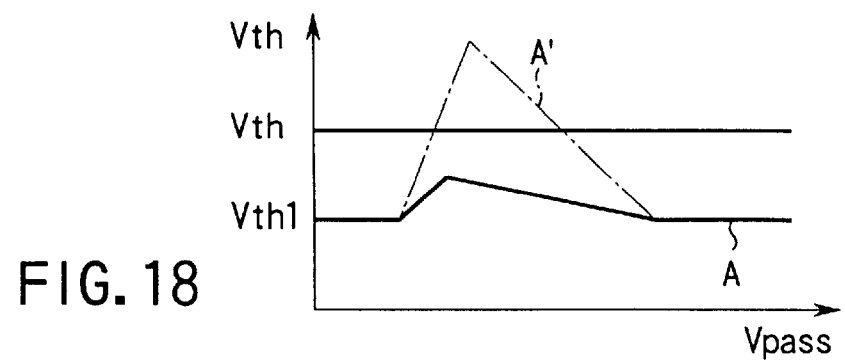
FIG. 18

NONVOLATILE SEMICONDUCTOR MEMORY DEVICE CAPABLE OF CONTROLLING MUTUAL TIMING OF WRITE VOLTAGE PULSE AND TRANSFER VOLTAGE PULSE

BACKGROUND OF THE INVENTION

The present invention relates to a NAND cell type nonvolatile semiconductor memory device using an electrically erasable memory cell with a floating gate electrode for accumulation of electric charge layered beneath a control gate electrode. More particularly, the memory cell includes plural memory cells connected in series. The invention also relates to a data writing control method in such a memory device.

Nonvolatile semiconductor memory devices are known that can be electrically erased and integrated to a high degree such as an EEPROM (electrically erasable programmable ROM). Specifically, a NAND cell type EEPROM connecting a plurality of memory cells in series is known as providing a high degree of integration. In such a NAND cell type EEPROM, the memory cell has a "stacked gate structure" in which a control gate electrode is laminated on a floating gate electrode over an insulation film on a semiconductor substrate. A plurality of memory cells are connected in series so that cells share sources and drains with adjacent cells. The string of series connected cells make up one unit connected to the bit line to constitute the NAND cell. The NAND cells are arranged in a matrix to make up the memory cell device.

The NAND cells are arranged along the column direction of the memory cell array and the drain of the end cell is connected to the bit line, which is the data line, through each selection gate electrode. The other end of the string of NAND cells is connected to the source line through the selection gate electrode and further to the common source line, which also provides the reference potential. The control gate electrode and selection gate electrode of each memory cell are connected in common along the row direction of the memory cell array, with the control gate electrodes connected to the word lines, and the selection gate electrodes connected to the selection gate lines.

When writing such a NAND cell type EEPROM, if a lower voltage operation can be achieved, the transistors that make up the column decode circuitry connected to the bit lines can be chosen to be $V_{CC}$ transistors. Conseqeuntly, the area of the peripheral circuit can be reduced. To achieve such a lower voltage operation, various technologies have proposed and adopted a "self-boost writing system," thereby reducing the chip size. The operation of such a self-boost writing system is described below.

FIG. 19 is a diagram showing an equivalent circuit of a memory cell of this NAND cell type EEPROM. In the diagram, the symbol BL is a bit line, SG is a selection gate line, CG is a word line, and SL is a source line.

In the usual batch writing of plural pieces of data into plural memory cells along a row direction, writing starts from a memory cell at a position remote from the bit line BL.

In a random writing operation, arbitrary memory cells between bit line BL and source line SL are written randomly. When writing, 0V is first applied to the bit lines BL1 to BLn of the NAND cell connected to the memory cell into which "0" data is to be written. Consequently, in the bit lines BL1 to BLn of the NAND cell to which the memory cell to be written with "1" data is connected, the same voltage as the drain side selection gate voltage, a higher voltage, or a potential for sufficiently cutting off the drain side selection gate if lower than the drain side selection gate voltage is applied, so that write selection and non-selection (write disable) can be distinguished in the bit lines BL1 to BLn.

In this state, when a potential for turning on the memory cell, that is, a write pulse voltage $V_{pp}$ or a transfer voltage pulse $V_{pass}$ of non-selection word line, is applied to all word lines CG1 to CGn of the selection block, if a potential for turning on the memory cell is applied at a specified potential in the rise potential of the voltage pulse, 0V is transferred to the channel of the NAND connected to the bit linesBL1 to BL2 for writing "0" data. Thus, when the write voltage pulse $V_{pp}$ is applied to the selection word lines CG1 to CGn connected to the memory cell to be written with "0" data, "0" data is written into the selection memory cell connected to the selection bit lines BL1to BLn to which 0V has been applied.

In the channel of the NAND cells connected to the bit lines BL1 to BLn to be written with "1" data, a specified initial potential, subtracting the threshold portion of the corresponding selection gate transistor from the potential of the bit lines BL1 to BLn through the selection gate line SG1 of the bit line side, is transferred from the bit lines BL1 to BLn. The bit line side selection gate transistor is cut off and floats. At this time, in the source line SL, 0V or a specified positive potential is applied in order to cut off sufficiently the source side selection gate.

Here, the channel potential of the non-selection memory cell connected to the selection word line to which write voltage pulse $V_{pp}$ is applied, for writing in "1" data, that is, the memory cell cutting off the bit line side selection gate transistor, with the channel in the floating state, must be sufficiently large so that "0" may not be written in. That is, the threshold fluctuation of the non-selection memory cell should be within an allowable range. This is because, in this memory cell, the fluctuation of threshold is smaller when the difference of the write voltage pulse $V_{pp}$ and channel potential Vch is smaller.

On the other hand, the specified transfer voltage pulse $V_{pass}$ is applied to the non-selection word line not to be written in, and the potential of the channel is raised to a certain potential from the initial potential by utilizing the capacitance between the gates and their channels. Therefore, as the transfer voltage pulse $V_{pass}$ is greater, the threshold fluctuation of the memory is smaller.

Thus, this transfer voltage pulse $V_{pass}$ is also applied to the memory cells in which "0" data is not written, among the memory cells connected to the selection bit lines provided with 0V for the bit lines BL1 to BLn. Therefore, the greater the transfer voltage pulse $V_{pass}$, the less likely the threshold fluctuates. Considering these points, the minimum value and maximum value of the transfer voltage pulse $V_{pass}$ are determined.

Usually, this transfer voltage pulse $V_{pass}$ and write voltage pulse $V_{pp}$ are controlled by the "step-up system" for optimizing the specified initial voltage, the step voltage, the final voltage and the pulse width in order to narrow the distribution of the threshold for "0" data memory cells and to reduce writing errors.

To erase data, on the other hand, either "batch erase" for simultaneously erasing all memory cells in the NAND type cell, or "block erase" for erasing the cells in a specified by unit is selected. That is, in all or selected blocks, 0V is applied to all control gates, and in the case of block erase, a write voltage pulse $V_{pp}$ (for example, 20V) is applied to the control gate and selection gate of the non-selected blocks, and the bit line and source line are set in a floating state and a high voltage, for example, 20V is applied to the p-well. As a result, in all memory cells of all or selected blocks, electrons of the floating gate are released to the p-well, and the threshold moves in the negative direction. Furthermore, to read out data, a write voltage (for example, 4.5V) is applied to the selection gate transistors and word lines of non-selection memory cells other than the selection memory cells to turn them on, while 0V is applied to the word lines of the selection memory cells. At this time, by detecting the current flowing in the bit lines BL1 to BLn, either "0" or "1" data is judged.

However, in the "self-boost writing method" conventionally used for the NAND cell type EEPROM, the following problems were known, and have required solution.

FIG. 20 is a diagram showing an equivalent circuit of a NAND cell type EEPROM including electrodes of memory cells in floating channel writing, and memory cell A and memory cell B. Memory cell A is a write non-selection memory cell, having a floating channel, and provided with write voltage pulse $V_{pp}$ in the word line, in which "1" data is written. The memory cell B is a non-write, non-selection memory cell provided with 0V in the bit line and transfer voltage pulse $V_{pass}$ in the word line. Here, VBL is a voltage applied to the bit line, VSG is a voltage applied to the word line, and VSL is a voltage applied to the source line. In this example, the second memory cell counting from the bit lines BL1 to BLn is the selection word line, but an arbitrary memory cell is selected in usual operation.

Referring now to the timing chart in FIG. 21, the voltages on the electrodes corresponding to FIG. 20 and their timing are specifically described below.

First, for the bit lines BL1 to BLn, 0V or $V_{CC}$ (for example, 3.3V) is applied for the data to be written in; $V_{CC}$ (for example, 3.3V) is supplied to the selection gate SG1 side of bit lines BL1 to BLn and 0V is supplied to the selection gate SG2 of the source line SL side. In this state, the channel of the NAND cell of the bit line (BBL1) to write "1" data in is set in a floating state after the channel potential Vchinit is transferred. Afterwards, a write voltage pulse $V_{pp}$ is applied to the selection word line, and a transfer voltage pulse $V_{pass}$ is supplied to the non-selection word line, so that the channel in the floating state is boosted to the specified potential Vch. At this time, the relation between the channel potential Vch and the potential of each electrode is expressed by formula (1).

$$Vch=Vsg-V_{sgth}(Vchinit)+Cr1(V_{pass-Vpassth}-Vchinit)+Cr2(V_{pp}-V_{passth}-Vchinit)-(Tpw/16(Cins+Cch))\cdot I \quad (1)$$

In this formula (1), $V_{sgth}$(Vchinit) denotes the threshold of the drain side selection gate at the channel potential of Vchinit, Cr1 indicates the channel boost ratio (the ratio of capacity of memory cell provided with transfer voltage pulse $V_{pass}$ to capacity depletion layer widening beneath the channel due to this pulse $V_{pass}$), Cr2 is the channel boost ratio (the ratio of capacity of memory cell provided with a write voltage pulse $V_{pp}$ to a capacity of depletion layer widening beneath the channel due to this pulse $V_{pp}$), and $V_{passth}$ shows the potential necessary for turning on the memory cell provided with transfer voltage pulse $V_{pass}$ when the channel potential is Vchinit. Tpw is the write voltage pulse width, Cins is the capacity per memory cell, Cch is the depletion layer widening beneath the channel, and I shows the current flowing from the channel through the well or adjacent bit line.

Depending on the profile of impurity concentration (boron impurity concentration, etc., when forming in p-wells) in the selection gate SG1, SG2, memory cells, and the semiconductor substrate in which they are formed, impurity concentration of channel implant injected into channels of selection gates SG1, SG2 and memory cells, and various conditions for forming the selection gates and memory cells, the initial voltage Vchinit to be transferred from the bit lines BL1 to BLn to the channel may be lowered. Alternately, the channel boost efficiency (Cr1, Cr2) may be lowered due to the increase in the capacity of the depletion layer beneath the channel or between the 0V terminal and channel, and therefore sufficient channel potential may not be obtained. Consequently, the threshold of the memory cell of "1" data writing may fluctuate, and writing errors may occur.

FIG. 22 is a diagram showing the relation of the transfer voltage pulse $V_{pass}$ in the above-described case of writing, and the threshold of the memory cell (memory cell A) for writing the "1" data. In the diagram, the axis of ordinates denotes the threshold, and the axis of abscissas indicated $V_{pass}$, symbol A relates to the characteristic of cell A, and B shows the characteristics of cell B. As shown in the diagram, unless the transfer voltage pulse $V_{pass}$ is sufficiently large, the threshold of the memory cell A fluctuates to the positive side. By contrast, if the transfer voltage pulse $V_{pass}$ is too large, the threshold of the memory cell B fluctuates.

Such threshold fluctuations tend to be larger along with increases in the fluctuation of the writing characteristic due to non-uniformity of the gate width, gate length, wing width, tunnel oxide film thickness, inter-poly insulation film (interlayer insulation film) thickness and other conditions of the memory cells. In particular it is more likely to occur as the number of bits of the selection block is larger when writing.

Moreover, if the leak current is large in the floating channel, in the source-drain diffusion layer, between wells, or between adjacent bit lines, the threshold fluctuation is much larger. Or, when transferring the bit line potential to the channel, characteristic fluctuations of the selection gate transistor may be further larger.

It is thus known that the characteristics of the memory cells and selection gate transistors impair the writing error characteristics, and for their improvement, it is required to improve the process, structure and operation (see D. J. Kim: "Process Integration for the high Speed NAND Flash Memory Cell" and "A Novel Booster Plate Technology in High Density NAND Flash Memories for Voltage Scaling-Down and Zero Program Disturbance" in 1996 Symposium on VLSI Technology Digest of Technical Papers, which gives rise to problems such as complication of process, increase in the number of processes, and increase of chip size. Besides, the presence of threshold fluctuation may have significant effects on data holding characteristics of memory cells when reading or letting stand, possibly leading to decline of reliability.

In the conventional approaches to reducing writing errors, nothing is mentioned about the timing of applying the write voltage pulse $V_{pp}$ or transfer voltage pulse $V_{pass}$ to the non-selection word line, or adjusting the rise time and fall time, and no measure has been put in practical use.

In particular, hitherto, concerning the write voltage pulse $V_{pp}$ and transfer voltage pulse $V_{pass}$, it was believed that the writing errors could be minimized by applying the pulse $V_{pp}$ while boosting the channel potential by the pulse $V_{pass}$. To the contrary, this further increases the writing errors.

FIGS. 23A and 23B are diagrams showing the timing of the conventional write voltage pulse $V_{pp}$ and transfer voltage pulse $V_{pass}$. FIG. 23A shows $V_{pp}$, and FIG. 23B shows $V_{pass}$. In these diagrams, t1, t1' are the time to generate pulses $V_{pp}$, $V_{pass}$ respectively, t2, t2 are the time to reach the maximum value after the rise of the pulses, t3, t3' are the times to start falling, and t4, t4' are the times until the pulses fall completely. In the prior art, the pulses $V_{pp}$ and $V_{pass}$ are applied almost simultaneously. Alternately, in the belief that pulse $V_{pass}$ should be generated earlier than pulse $V_{pp}$, pulse $V_{pp}$ is given later (t1≧t1'), and hence the pulse $V_{pass}$ rise slightly earlier (t2'<t2). Concerning the fall, either the pulses fall simultaneously or the pulse $V_{pass}$ falls later (t3≧t3', t4<t4') according to the belief that the pulse $V_{pass}$ should be present while pulse $V_{pp}$ is being generated. Actually, however, the pulse timing is not strictly controlled, and includes fluctuations, with all memory cells are not always operating at such timing. Hence, writing errors are more likely to occur.

SUMMARY OF THE PREFERRED EMBODIMENTS

It is hence an object of the invention to present a nonvolatile semiconductor memory device notably improved in writing error characteristics, and a data writing control method in such memory device.

To achieve the object, a first aspect of the invention relates to a nonvolatile semiconductor memory device comprising a memory cell array having plural electrically erasable programmable memory cells each including a gate, a source, a drain, and an electric charge accumulation layer disposed in a matrix form. The device includes a data writing section for writing data into memory cells in the memory cell array, a data reading section for reading out data in memory cells of the memory cell array, a data erasing section for erasing data in memory cells of the memory cell array, and a control section. When applying a first pulse to a gate of a specified memory cell inhibited of writing and applying a second pulse to a node capacitively coupled to at least one of source and drain of the memory cell, in writing data into the memory cells, the control section causes the first pulse to fall later then the second pulse.

A second aspect of the invention relates to a nonvolatile semiconductor memory device, where a second conductive type well is formed in one of first conductive type wells formed in a second conductive type wells formed in a second conductive type semiconductor substrate and a first conductive type semiconductor substrate.

Plural erasable programmable memory cells having a first conductive type source and drain diffusion layers are formed in the second conductive type well. A floating gate as an electric charge accumulation layer is formed above the region disposed between the source and drain diffusion layers separated by a tunnel insulation film. A control gate is laminated above the floating gate through an interlayer insulation film for rewriting data by transferring electric charge between the electric charge accumulation layer and the second conductive type well disposed in the second conductive type well. The plural memory cells are connected in series in a form of sharing the source and drain between adjacent ones to compose NAND cells, which are disposed in a matrix form to compose a memory cell array. The drain at one end of each NAND cell is connected to a bit line disposed in a column direction through a selection gate, the source at an other end is connected to a source line shared by plural NAND cells through a selection gate, and the control gate in each NAND cell is consecutively disposed in the NAND cells arranged in a row direction to compose a word line.

In a writing operation for storing desired data by an electric charge amount accumulated in the floating gate in each memory cell, plural pieces of data are written into plural NAND cells arranged in the row direction in a batch by applying a first voltage for not cutting off a drain side selection gate transistor to the bit line of the NAND cell selected of writing, and applying a second voltage for cutting off the drain side selection gate transistor to the bit line of the NAND cell inhibited of writing while cutting off a source side selection gate transistor. When a write voltage pulse $V_{pp}$ is applied to the word line connected to a memory cell into which data is to be written and transfer voltage pulse $V_{pass}$ is applied to the word line connected to a memory cell into which data is not to be written, and the fall start time of the transfer voltage pulse $V_{pass}$ is set earlier than the fall start time of the write voltage pulse $V_{pp}$.

Additional objects and advantages of the invention will be set forth in the description that follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description given above and the detailed description given above and the detailed description of the preferred embodiments given below, serve to explain the principles of the invention.

FIGS. 15A and 15B are timing charts of a write voltage pulse $V_{pp}$ and a transfer voltage pulse $V_{pass}$ according to a first embodiment of the present invention;

FIGS. 16A and 16B are timing charts of write voltage pulse $V_{pp}$ and transfer voltage pulse $V_{pass}$ in a second and a third embodiment of the present invention.

FIGS. 17A and 17B are timing charts of write voltage pulse $V_{pp}$ and transfer voltage pulse $V_{pass}$ according to a fourth and a fifth embodiments of the present invention;

FIG. 18 is a diagram for explaining the effects of the invention;

DETAILED DESCRIPTION OF THE PREFERRED EMBODIMENTS

Figure 1:
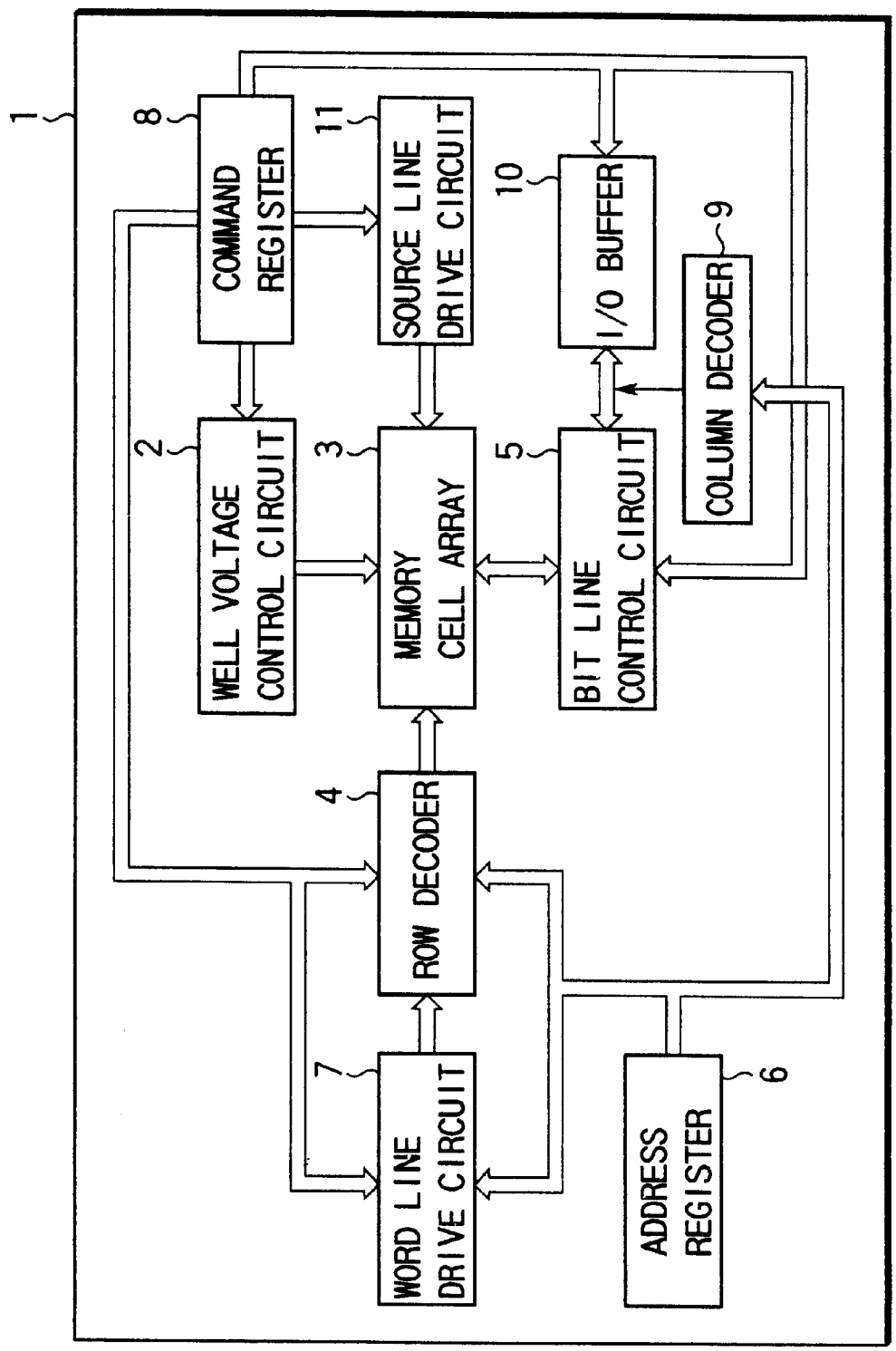
FIG. 1 is a diagram showing a constitution of a nonvolatile semiconductor memory device according to the invention.

Referring now to the drawings, preferred embodiments of the invention are described in detail below.

The embodiments of the invention are applied to EEPROM self-boost writing methods, and the same effects are brought about regardless of the memory cell structure, element separation structure (LOCOS, trench), structure or number of selection gates, number of pieces of data stored in memory cells (binary memories or multi-value memories), manufacturing method, etc.

FIG. 1 is a diagram showing a constitution of a nonvolatile semiconductor memory device according to the invention.

In a nonvolatile semiconductor memory device 1 shown in the diagram, the output of an address register 6 is connected to the inputs of a word line drive circuit 7, a row decoder 4, and a column decoder 9, and the output of the word line drive circuit 7 is connected to the input of the row decoder 4, and the output of the column decoder 9 to the inputs of the bit line control circuit 5 and I/O buffer 10. On the other hand, the output of a command register 8 is connected to the inputs of the word line drive circuit 7, row decoder 4, I/O buffer 10, bit line control circuit 5, well voltage control circuit, and source line drive circuit 11, and the bit line control circuit 5 and I/O buffer 10 are mutually connected. The outputs of the row decoder 4, well voltage control circuit 2, source line drive circuit 11, and bit line control circuit 5 are connected to the input of the memory cell array 3. The memory cell array 3 is specifically composed of plural nonvolatile memory cells formed in a matrix.

In such constitution, the memory cell array 3 is designed to write, read or erase data. The bit line control circuit 5 latches the data to be written into the memory cells of the memory cell array 3 when writing, and senses and latches the data to be read out appearing on the bit line when reading out. The I/O buffer receives data, when writing, from outside of the nonvolatile semiconductor memory device 1, and issues data to the bit line control circuit 5. The column decoder 9 is to mutually connect plural bit line control circuits 5 and one I/O buffer 10. The row decoder 4 is to select the block of the address entered from the memory cell array 3. The word line drive circuit 7 is to issue the voltage to be applied to the word line of the selected memory cell. The address register 6 latches the address data entered from outside, and selects the word line and bit line of the selected specific memory cell through the column decoder 9, row decoder 4, and the word line control circuit 7. The well voltage control circuit 2 and source line drive circuit 11 are to control the potential of the well and source of the memory cell array 3 depending on the operation mode such as data reading or writing. The command register 8 sends out a specified instruction signal to each control circuit of the apparatus depending on the read, write or erase instruction relating to an entered specified command.

Figures 2, 3, 4:
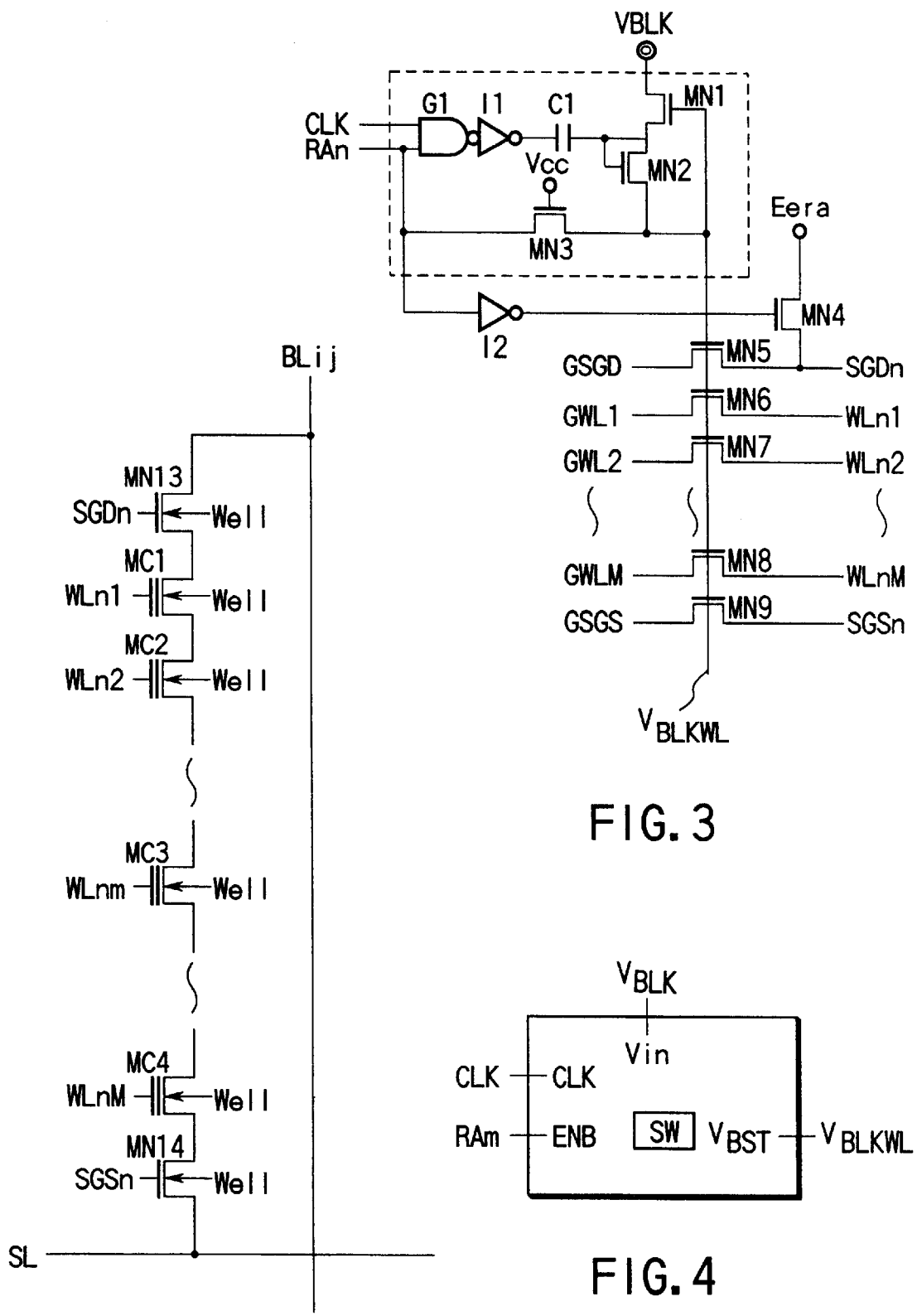
FIG. 2 is a diagram showing a detailed constitution of a "string" of NAND cells for composing a memory cell array 3.
FIG. 3 is a diagram showing a specific constitution of a row decoder 4.
FIG. 4 is a block structural diagram of a booster circuit of the row decoder 4.

FIG. 2 is a diagram showing a detailed constitution of "string" of NAND cells making up the memory cell array 3.

As shown in the drawing, in one string, M memory cells MC1 to MC4 are mutually connected in series, and selection transistors MN13, MN14 are connected at both ends of their connection. The selection transistor MN13 has already connected to the bit line BLij, and the selection transistor MN14 is connected to the source line SL. The memory cells MC1 to MC4 and selection transistors MN13, MN14 are all formed on a same well. The control gate of each memory cell is connected to word lines WLn1 to WLnM (n=1, . . . , N). A set of memory cells belonging to a same n composes a block, and data operation, that is, write, read or erase, is done in block unit.

FIG. 3 shows and explains a constitution of a specific example of the row decoder 4.

In the diagram, in a selected block, row address RAn is High level, and in a nonselected block, row address RAn is Low level. In the diagram, the circuit enclosed by a dotted line is a booster circuit, and FIG. 4 is its block structural diagram. The selected booster circuit boosts the input voltage VBLK by input clock CLK, and issues to signal line $V_{BLKWL}$. The value of VBLK is $V_{read}$ when reading, $V_{pgm}$ when writing, and $V_{CC}$ when erasing.

Here, the values of $V_{read}$ and $V_{pgm}$ are about 4 to 5V and 16 to 20V, respectively, and $V_{CC}$ is the supply voltage. Thus, in a selected row decoder, transfer gate transistors MN5 to MN9 are turned on, and signals common to all blocks GSGD, GWL1 to GWLM, GSGS are connected to SGDn, W1n1 to W1nM, SGSn, respectively.

Figure 5:
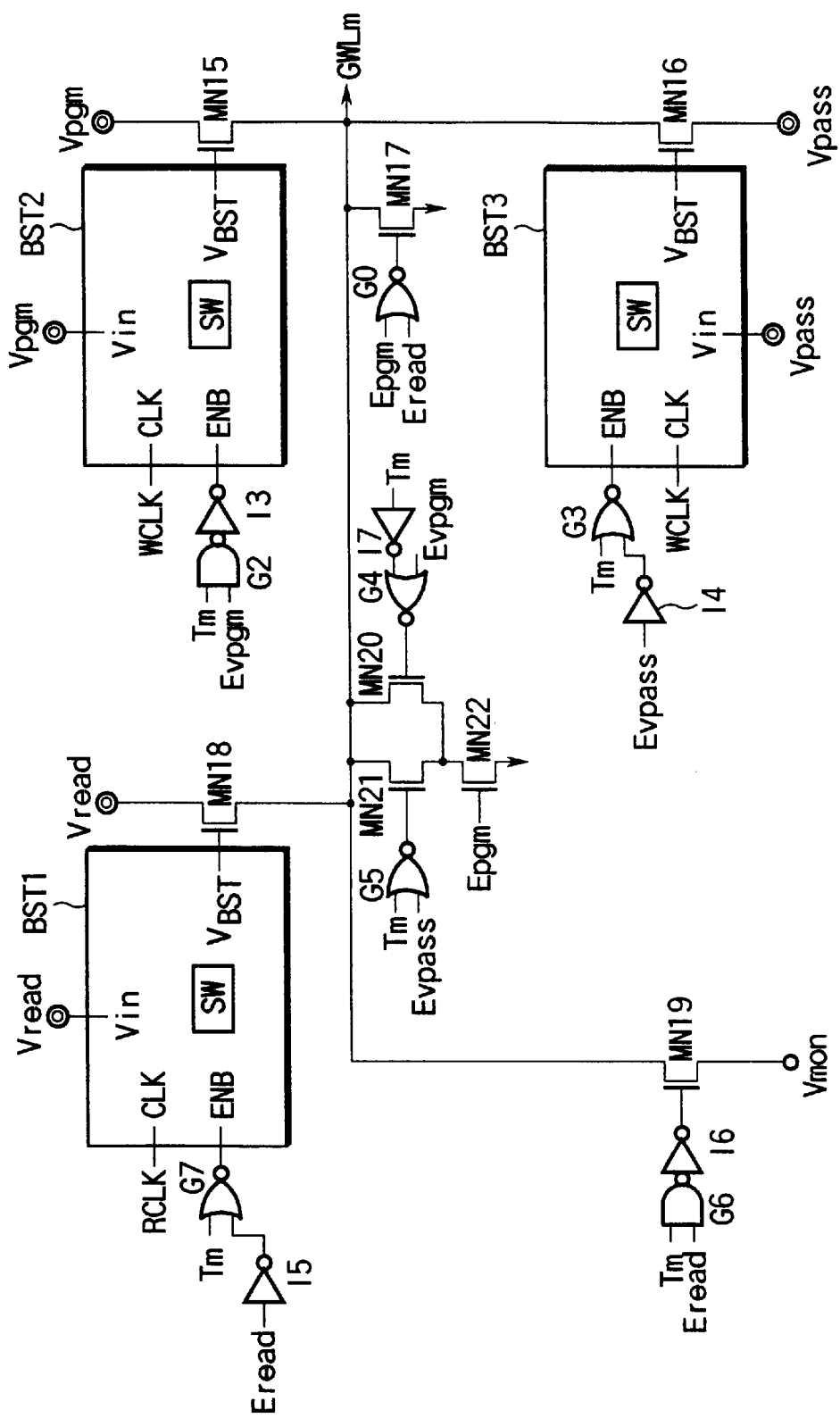
FIG. 5 is a diagram showing a constitution of a GWL drive circuit.

FIG. 5 is a diagram showing a constitution of a GWL drive circuit.

In the diagram, a first booster circuit BST1 includes a terminal CLK for receiving input of a clock signal RCLK, a terminal ENB for receiving signal of NOR circuit G7 which has received an inverted input of signal $E_{read}$ through an inverter 15 and signal Tm, and a terminal $V_{in}$ for receiving signal $V_{read}$, and issues a specified signal from terminal VBST depending on the state of these input signals, and controls the state of transistor MN18.

A second booster circuit BST2 includes a terminal CLK for receiving input of clock signal WCLK, a terminal ENB for receiving inverted input through the inverter circuit 13 of the signal of NAND circuit G2 which has received signal $E_{pgm}$ and signal Tm, and a terminal $V_{in}$ for receiving signal $V_{pgm}$, and issues a specified signal from terminal VBST depending on the state of these input signals, and controls the state of transistor MN15.

Similarly, a third booster circuit BST3 includes a terminal CLK for receiving input of clock signal WCLK, a terminal ENB for receiving signal of NOR circuit G3 which has received inverter input of signal $E_{vpass}$ through an inverter 14 and signal Tm, and a terminal $V_{in}$ for receiving signal $V_{pass}$, and issues a signal from terminal VBST depending on their state, and controls the state of transistor MN16.

The signal through an inverter 16 of output signal of a NAND circuit G6 for receiving signal Tm and signal $E_{read}$ is connected to the gate of a transistor MN19, and the state of the transistor MN19 is controlled depending on the state of this output signal. Furthermore, signal $V_{read}$ through the transistor MN18, signal $V_{pgm}$ through the transistor MN15, signal $V_{pass}$ through the transistor MN16, and signal Vmon through the transistor MN19 are connected to the same signal line leading to an output terminal GWLm.

Moreover, to the same signal line are connected the drain of transistor MN21 having the output of NOR circuit G5 for receiving signal Tm and signal $E_{vpass}$ connected at its gate, and the drain of transistor MN20 having the output of NOR circuit G4 for receiving the inverted input of signal Tm and $E_{vpgm}$ connected at its gate. The sources of the transistors MN21 and MN20 are mutually connected, and the connection end is connected to the drain of the transistor MN22. Signal $E_{pgm}$ is entered in the gate of this transistor MN22, and the source is grounded.

In addition, to this signal line, the drain of transistor MN17 is connected, and the output of NOR circuit G0 for receiving signal $E_{pgm}$ and signal $E_{read}$ is connected to the gate of this transistor MN17, and its source is grounded.

Figure 6:
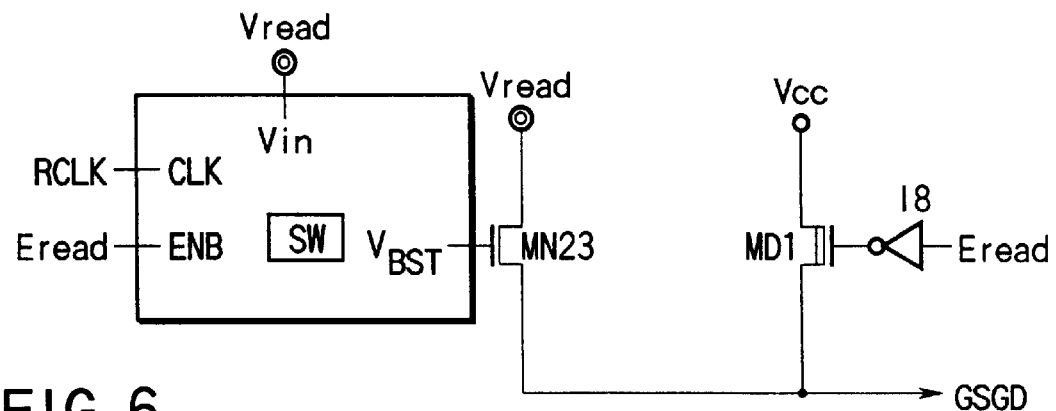
FIG. 6 is a diagram showing a constitution of a GSGD drive circuit.

In such constitution, depending on the state of the transistors MN15, MN16, MN18, MN19, one of $V_{pgm}$, $V_{pass}$, $V_{read}$ and Vmon is issued at the timing described below as signal GWLm. FIG. 6 is a diagram showing a constitution of GSGD drive circuit. As shown in the diagram, in this drive circuit, the state of the transistor MN23 is controlled by a signal from terminal VBST of the booster circuit including terminal CLK for receiving input of clock signal RCLK, terminal ENB for receiving input of signal $E_{read}$, and terminal $V_{in}$ for receiving input of signal $V_{read}$. The drain of the transistor MN23 is connected to the input terminal of signal $V_{read}$, and the source is guided into GSGD. Between the source of the transistor MN23 and the GSGD end, voltage $V_{Cc}$ is connected through transistor MD1, and an inverted input of signal $E_{read}$ through inverter 18 is connected to the gate of this transistor MD1. That is, the state of the transistor MD1 is controlled by $E_{read}$. In such constitution, depending on the state of the transistors MN23, MD1, either $V_{read}$ or $V_{CC}$ is issued from the output GSGD at a specified timing described below.

Figure 7:
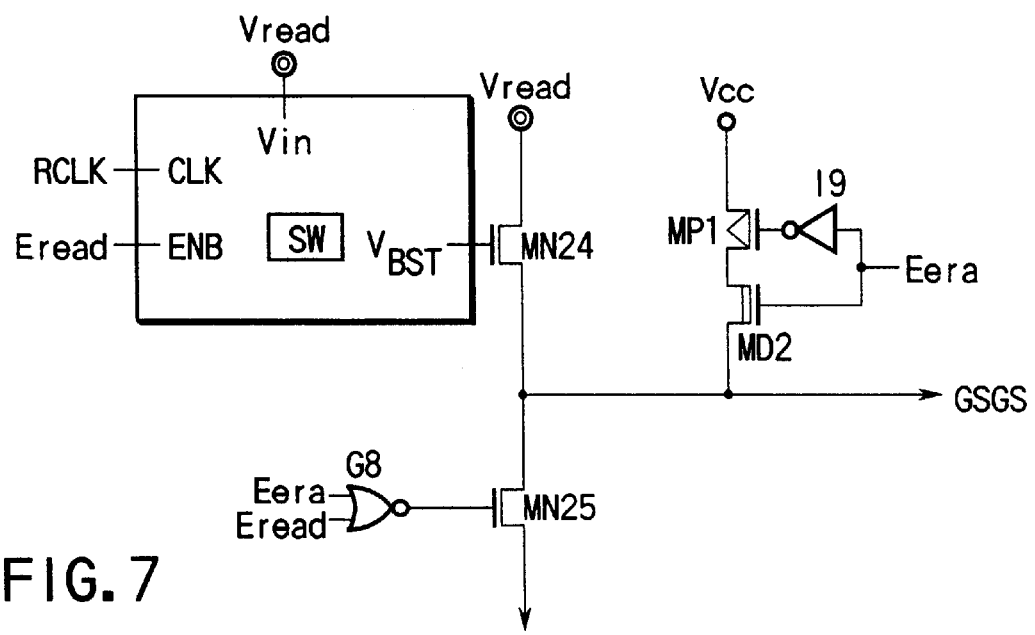
FIG. 7 is a diagram showing a constitution of a GSGS drive circuit.

FIG. 7 is a diagram showing a constitution of a GSGS drive circuit.

As shown in the diagram, the output terminal $V_{BST}$ of the booster circuit including terminal CLK for receiving input of clock signal RCLK, terminal $E_{NB}$ for receiving input of signal $E_{read}$, and terminal $V_{in}$ for receiving input of signal $V_{read}$ is connected to the gate of transistor MN24. The drain of the transistor MN24 receives input of signal $V_{read}$, and its source is connected to the drain of transistor MN25. The output of NOR circuit G8 for receiving signal $E_{era}$ and signal $E_{read}$ is connected to the gate of transistor MN25, and the source of this transistor MN25 is grounded. The input of signal $E_{era}$ is connected to the gate of transistor MD2, and inverted input of signal $E_{era}$ is connected to the gate of transistor MP1, and the drain of the transistor MP1 is connected to the voltage $V_{CC}$, and its source is connected to the drain of transistor MD2. The source of this transistor MD2, and the connection end of the transistors MN24 and MN25 are guided into output GSGS.

In such constitution, depending on the state of the transistors MN24, MN25, transistors MD1, MD2, either $V_{read}$ or $V_{CC}$ is issued from the output GSGS at a specified timing described below.

Figure 8:
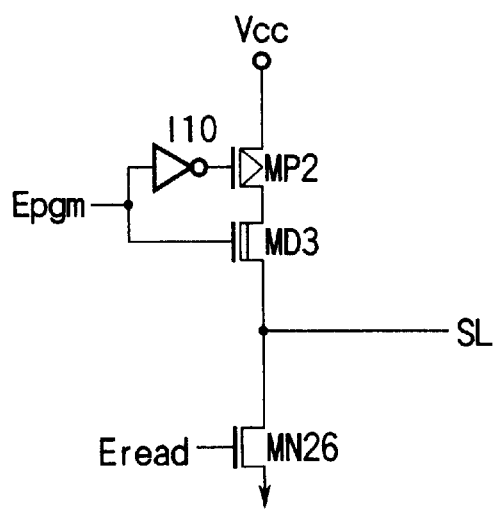
FIG. 8 is a diagram showing a constitution of a SL drive circuit.

FIG. 8 is a diagram showing a constitution of a SL drive circuit.

As shown in the diagram, the output of signal $E_{pgm}$ through inverter I10 is connected to the gate of the transistor MP2, and the output of signal $E_{pgm}$ is connected to the gate of transistor MD3. The drain of the transistor MP2 is connected to the voltage $V_{CC}$ end, and its source is connected to the drain of transistor MD3. On the other hand, input terminal of signal $E_{read}$ is connected to the gate of transistor MN26, and its source is grounded. The connection end of the transistors MD3 and MN25 is guided into outlet SL. In such constitution, depending on the state of the transistors MP2, MD3, MN26, voltage $V_{CC}$ is issued as output SL at a specified timing described below.

Figure 9:
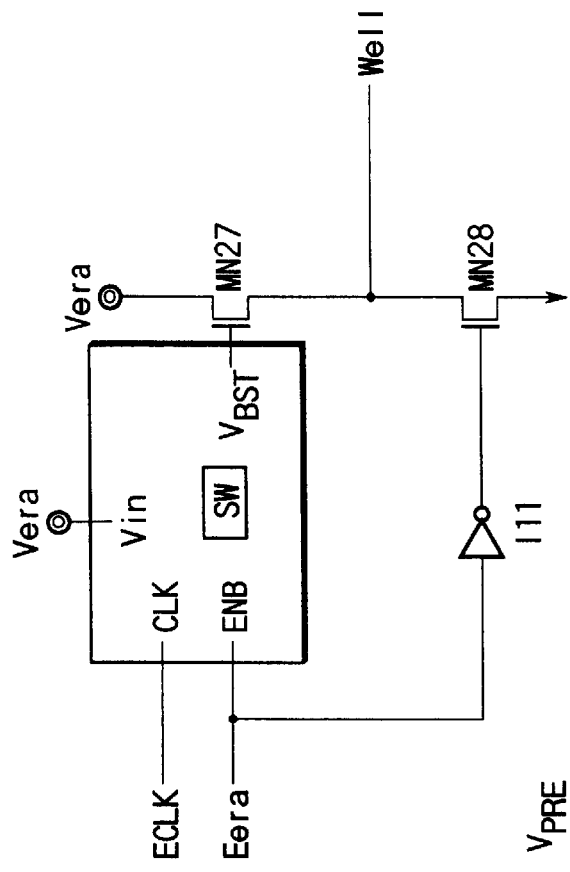
FIG. 9 is a diagram showing a constitution of a well drive circuit.

FIG. 9 is a diagram showing a constitution of a well drive circuit.

As shown in the diagram, the output terminal VBST of the booster circuit including terminal CLK for receiving input of clock signal SCLK, terminal ENB for receiving input of signal $E_{era}$, and terminal $V_{in}$ for receiving input of signal $V_{era}$ is connected to the gate of transistor MN27. The drain of the transistor MN27 is connected to the input end of signal $E_{era}$, and its source is connected to the drain of transistor MN28. To the gate of this transistor MN28, an inverted input of the signal $V_{era}$ is connected, and the source is grounded. The connection end of the transistors MN27 and MN28 is guided to the output well side. In such constitution, depending on the state of the transistors MN27, MN28, voltage $V_{era}$ is issued at a timing described below.

Figure 10:
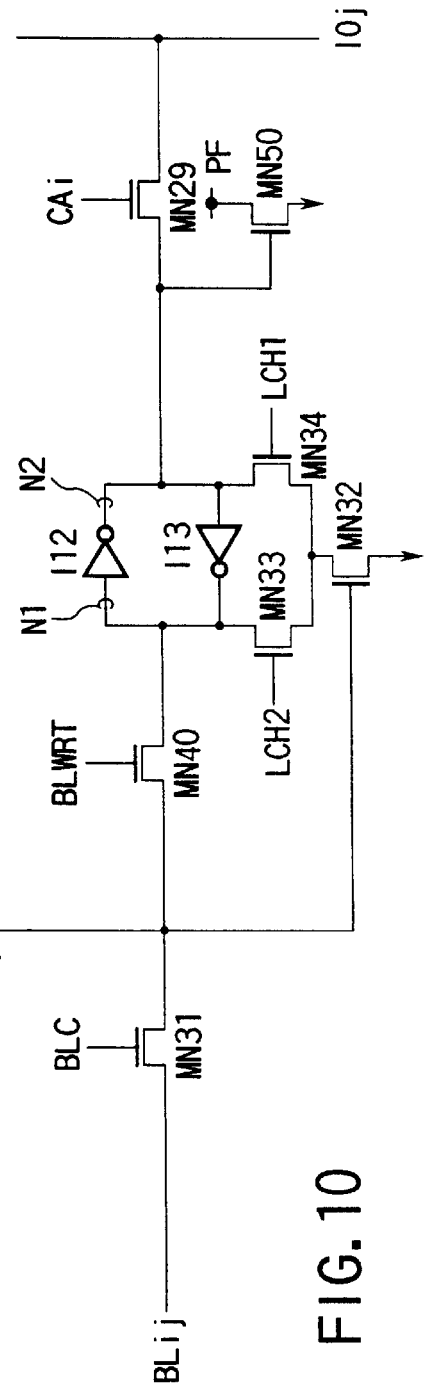
FIG. 10 is a diagram showing a constitution of a bit line control circuit.

FIG. 10 is a diagram showing a constitution of a bit line control circuit.

As shown in the diagram, the input end of signal BLij is connected to the input terminal of signal IOj through transistors MN31, MN30, inverters I12, I13, and transistor MN29. The input end of signal $V_{PRE}$ is connected to the connection end of the transistors MN31 and MN40 through transistor MN30, and is also connected to the gate of transistor MN32. The connection end of the inverter I12, I13 is connected to transistors MN33, MN34, and the connection end of the transistors MN32. According to the constitution, the gate of the transistor MN31 receives the input of signal BLC, the gate of the transistor MN30 receives the input of signal PRE, the gate of the transistor MN40 receives the input of signal BLWRT, the gate of the transistors MN33, 34 receives the input of signals LCH2, 1, and the gate of the transistor MN29 receives the input of signal $CA_i$. The connection end of the inverter I12 and transistor MN29 is connected to the gate of transistor MN50, and the drain of this transistor MN50 is designed to receive the input of signal PF.

Figure 14A:
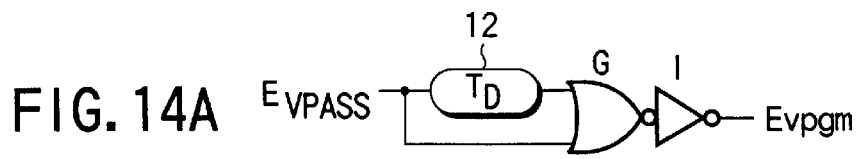
FIGS. 14A to 14F are diagrams showing five examples of a circuit for generating two input signals, $E_{vpass}$, $E_{vpgm}$, of GWL drive circuit, and a representative structural example of a delay circuit 12.
Figure 14B:
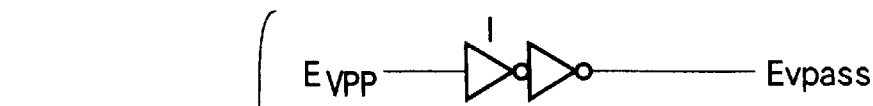
Figure 14C:
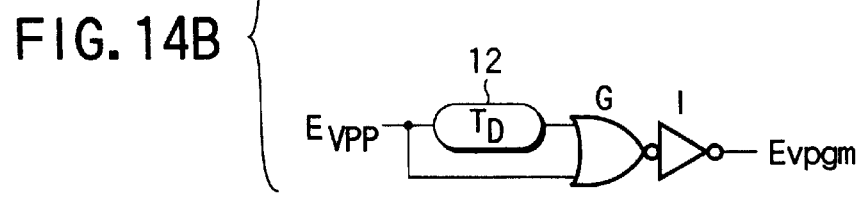
Figure 14D:
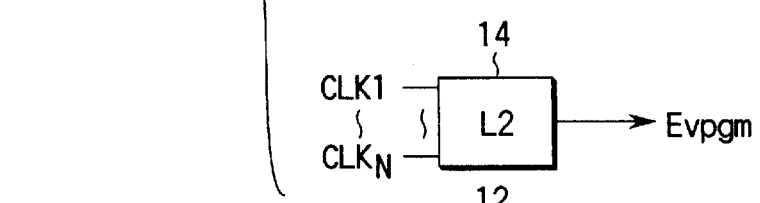
Figure 14E:
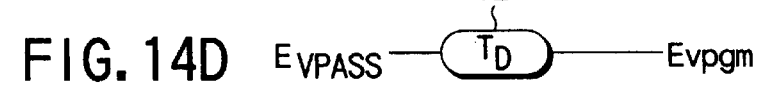
Figure 14F:
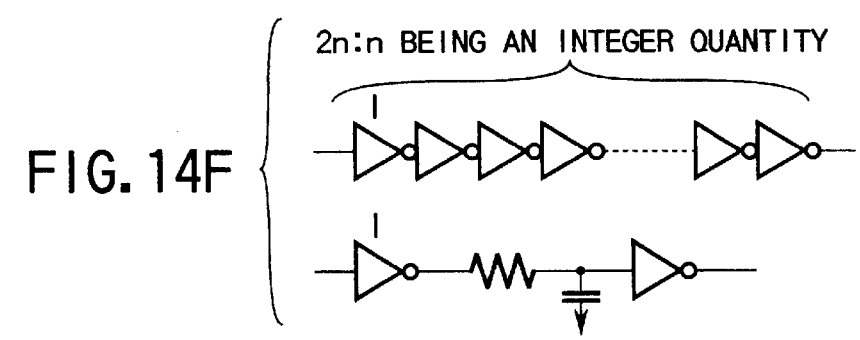
Figure 19:
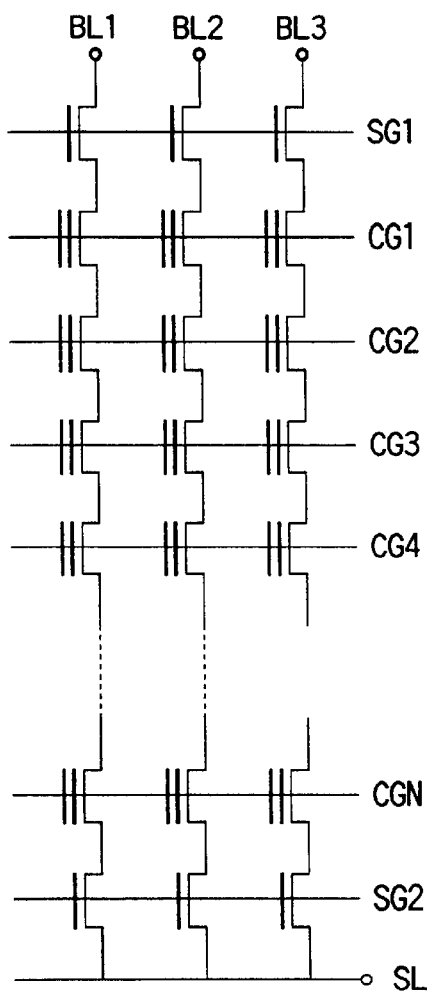
FIG. 19 is an equivalent circuit diagram of NAND type EEPROM memory cell in prior art.
Figure 20:
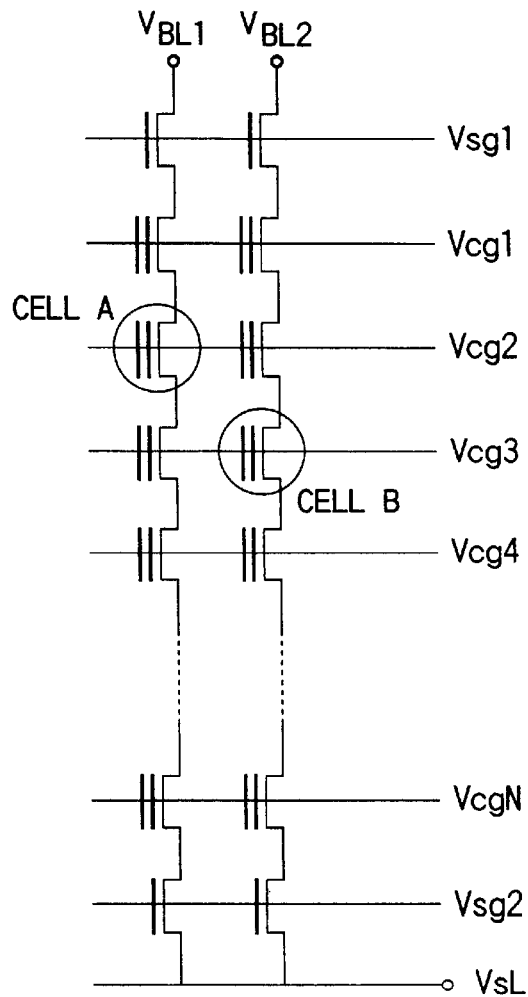
FIG. 20 is an equivalent circuit diagram showing each potential of self-boost writing method in prior art.
Figure 21:
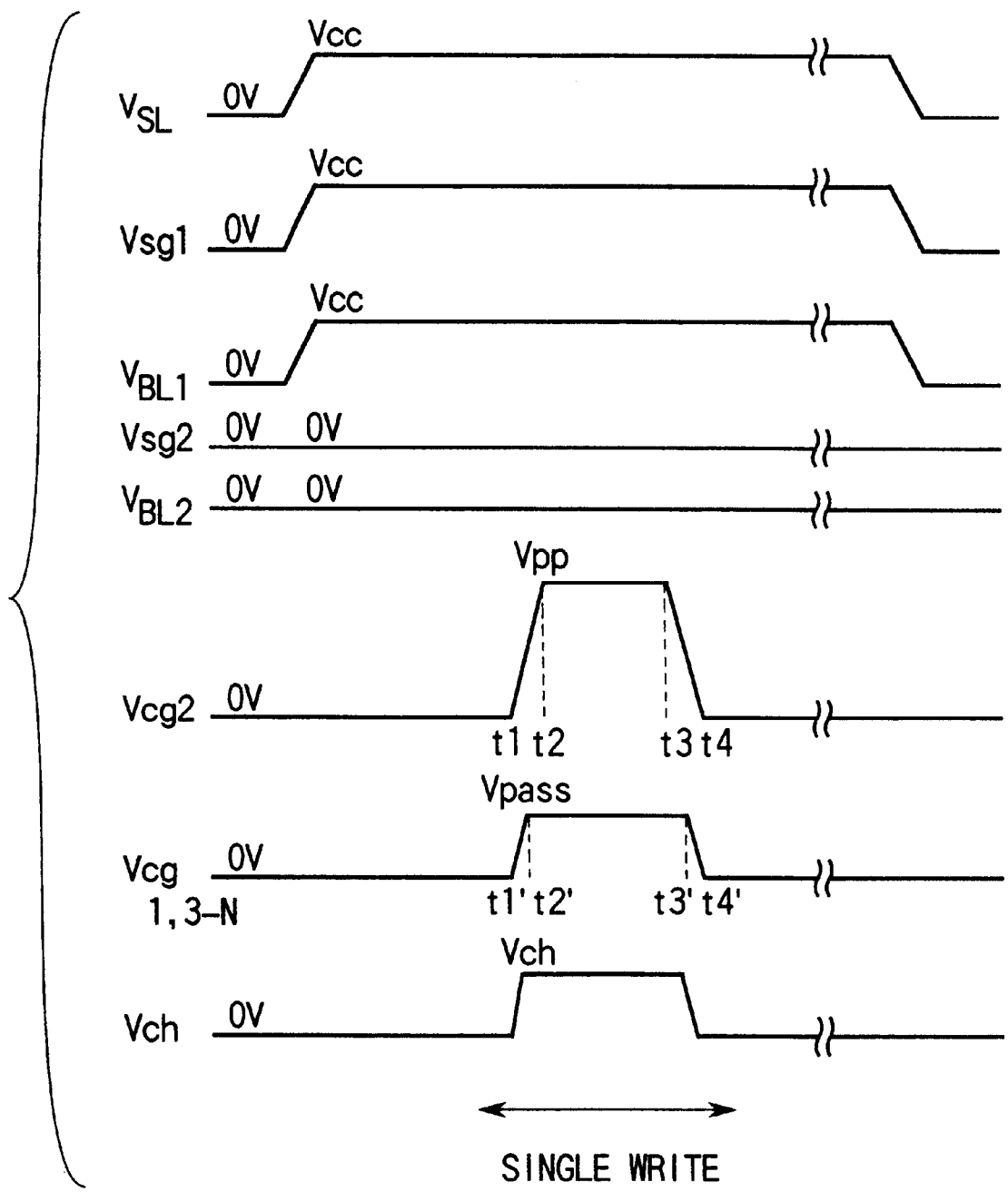
FIG. 21 is a timing chart of each potential in self-boost writing method in prior art.
Figure 22:
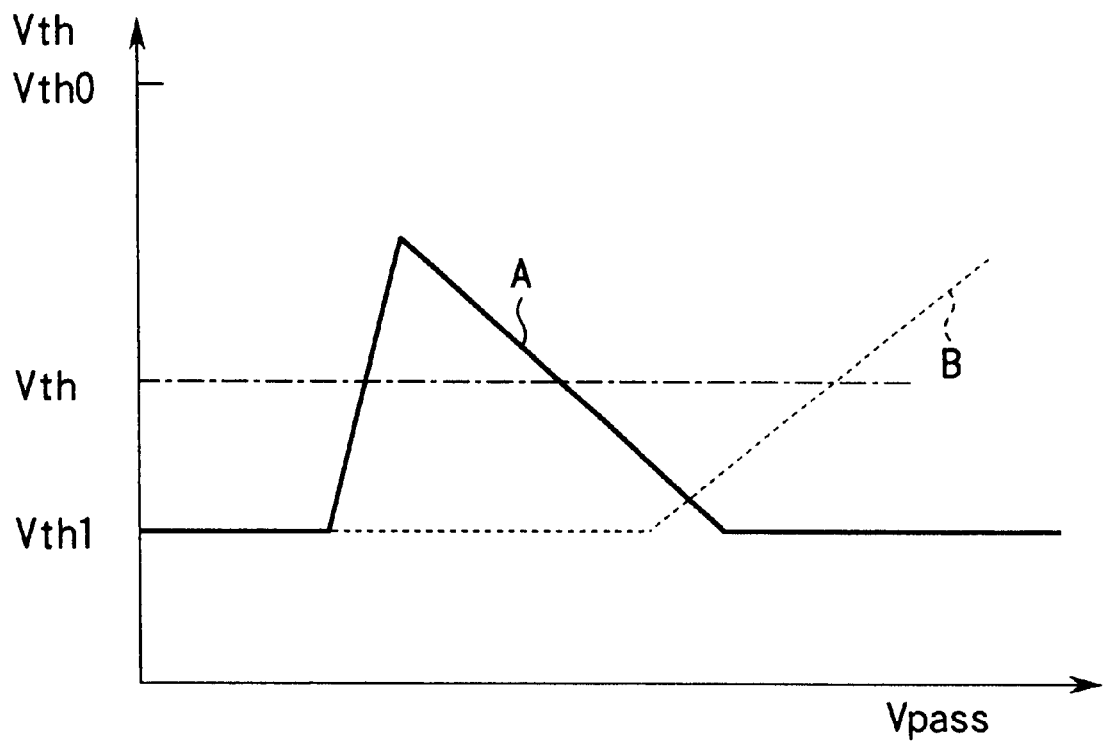
FIG. 22 is a diagram showing writing errors in prior art.
Figure 23A:
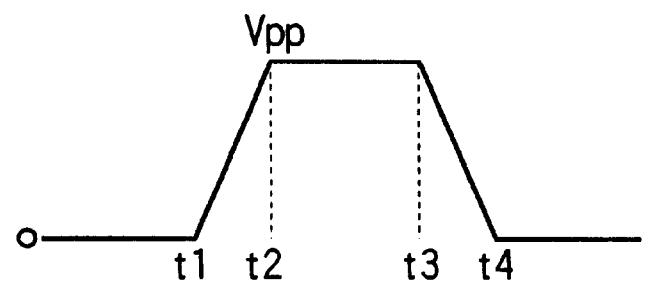
FIGS. 23A and 23B are timing charts of write voltage pulse $V_{pp}$ and transfer voltage pulse $V_{pass}$ in prior art.
Figure 23B:
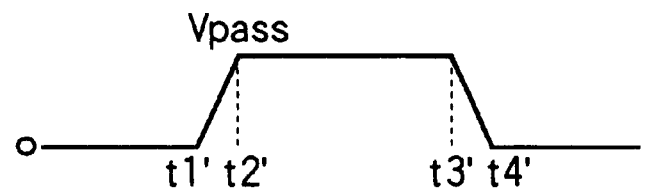

FIGS. 14A to 14F are diagrams showing five examples of the circuit for generating two input signals $E_{vpgm}$ (first signal) $E_{vpass}$ (second signal) of the GWL drive circuit. In the diagram, symbol G denotes a NOR circuit, and I means an inverter circuit. In FIGS. 14A and 14B, signals $E_{vpass}$ and $E_{vpgm}$ are generated from $E_{vpp}$ (third signal). A representative structural example of the delay circuit 12 is shown in FIG. 14F. FIG. 14C shows an example of a generating circuit of signals $E_{vpass}$, $E_{vpgm}$ composed of a binary counter (BC) 13 for generating plural clocks CLK1–N having periods of 2 times, 4 times, and so forth of the period of clock CLK, and logic circuits (L1, L2) 14 for logic calculation of the plural clocks. In FIGS. 14A and 14B, in rising, $E_{vpgm}$ and $E_{vpass}$ reach High level almost simultaneously, and in falling, $E_{vpass}$ becomes Low first, whereas in the circuit shown in FIGS. 14D and 14E, $E_{vpass}$ is earlier in both rising and falling. In FIG. 14C, by controlling the clock signal, both variations can be realized.

Figure 11:
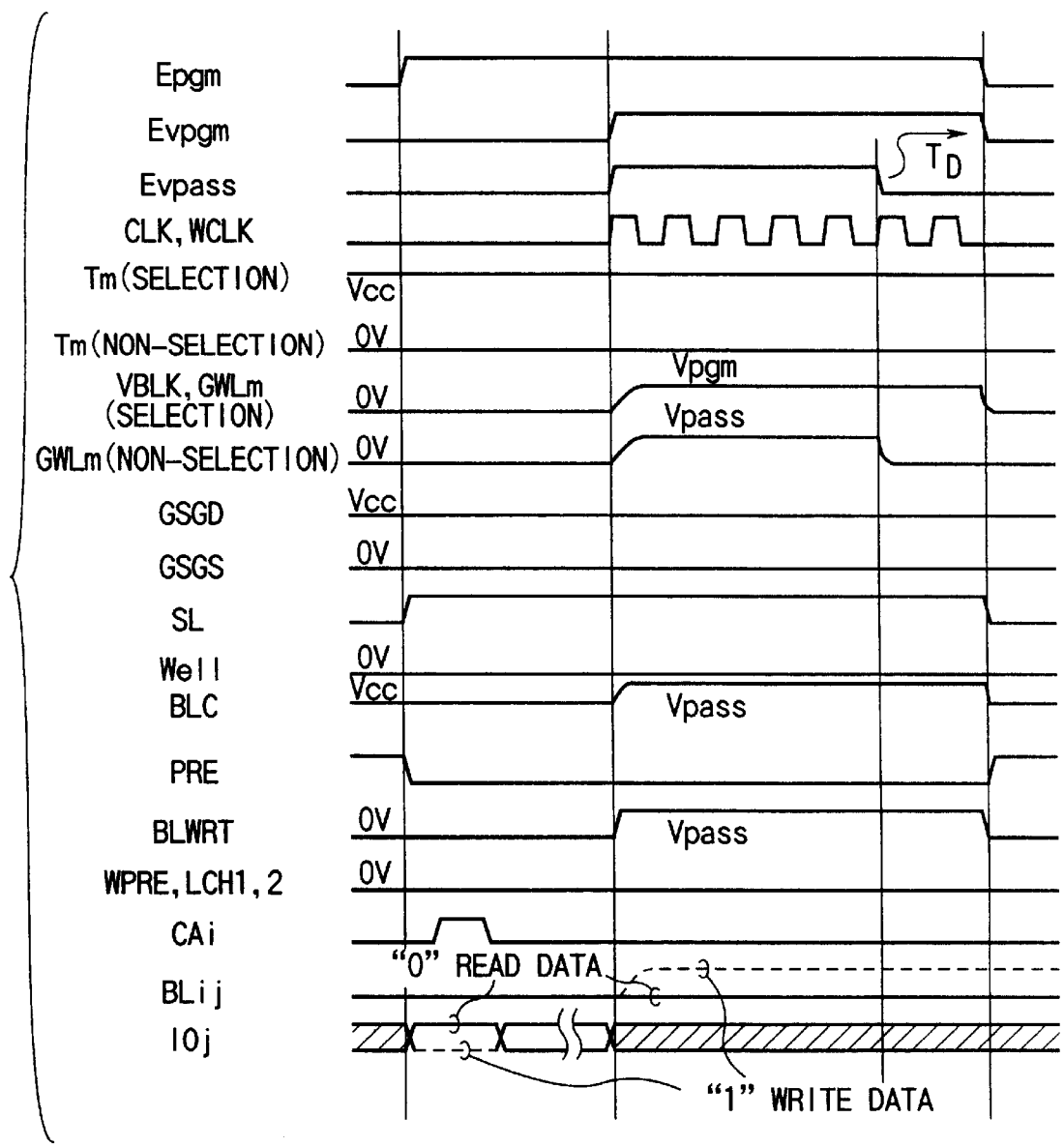
FIG. 11 is a timing chart for explaining the write operation of a nonvolatile semiconductor memory device according to the invention.
Figure 12:
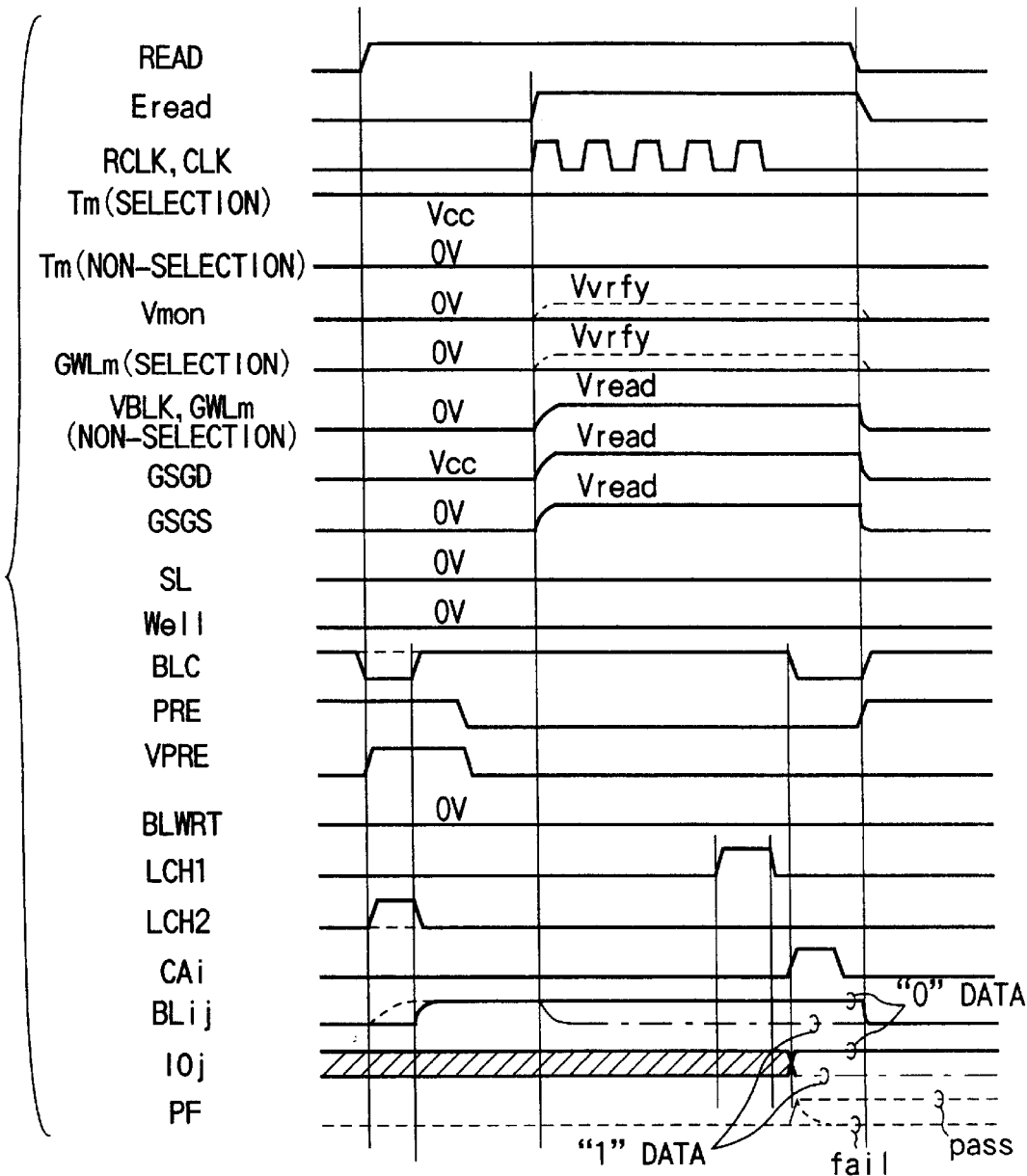
FIG. 12 is a timing chart for explaining the read operation of a nonvolatile semiconductor memory device according to the invention, along with a verify read operation for confirming whether data is written in or not in the memory cell.
Figure 13:
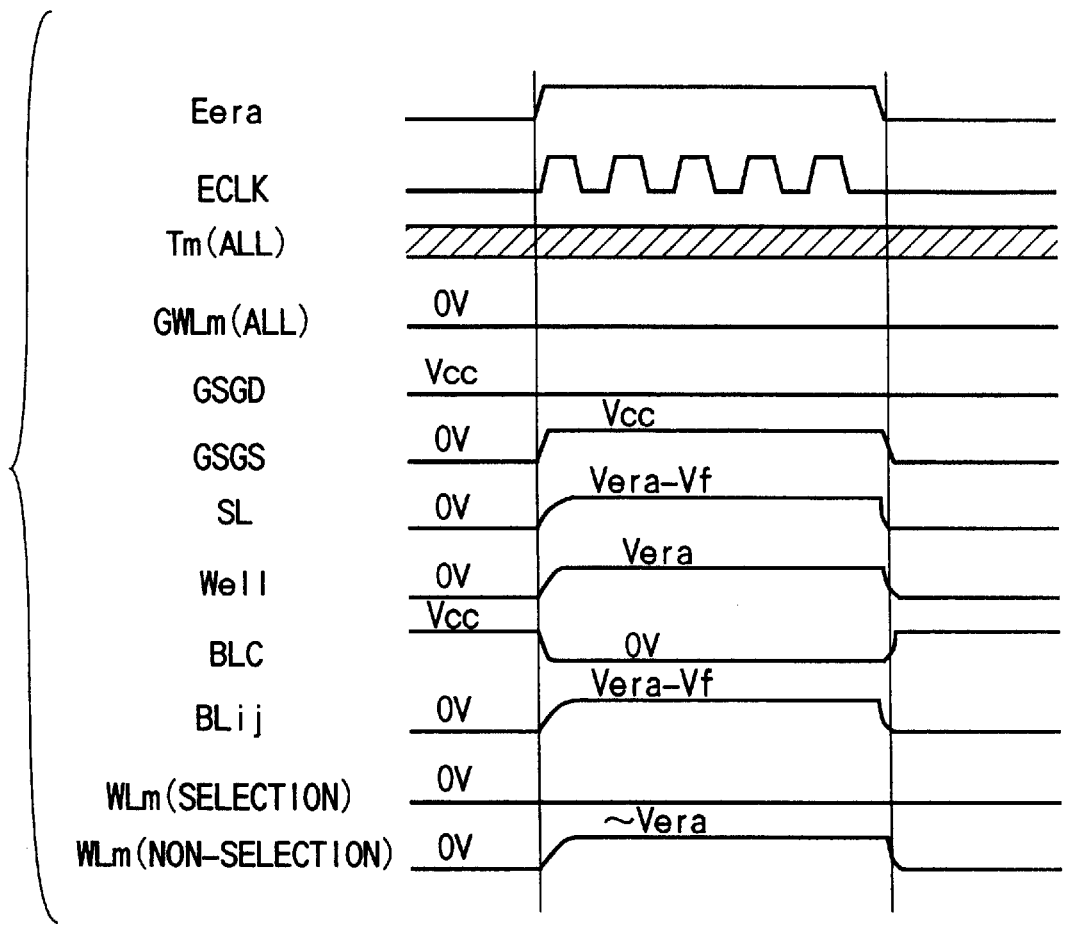
FIG. 13 is a timing chart for explaining the erase operation by a nonvolatile semiconductor memory device according to the invention.

Referring now to the timing charts in FIG. 11 to FIG. 13, the operation of writing, reading and erasing by the nonvolatile semiconductor memory device of the invention is described.

First referring to FIGS. 10 and 11, the writing operation is described.

When signal $E_{pgm}$ showing writing operation becomes High level, write data input operation is stated. This write data appears at 10 line (IOj) through the I/O buffer 10. At the timing when selection column address CAi becomes High level, the write data is latched in the latch circuit composed of inverters I12, I13. Here, latch circuit composed of inverters I12, I13. In "0" write data, node N1 corresponds to Low level, and node N2 to High level, and in "1" write data, node N1 corresponds to High level, and node N2 to Low level.

When data loading is thus over, writing into memory cells begins. When control signals $E_{vpgm}$, $E_{vpass}$ become High level, and clocks CLK, WCLK begin to work, voltage $V_{pgm}$ is applied to the selection word line, and voltage $V_{pass}$ (up to 10V) to the non-selection word line. On the other hand, in the control signals BLC, BLWRT of the bit line control circuit, voltage $V_{pass}$ is applied in order to transfer write bit line voltage 0V and write non-selection bit line voltage $V_{CC}$ to the bit line. In the write selected memory cell, the potential difference of gate and channel is $V_{pgm}$, and a tunnel current flows, so that the data of the memory cell becomes zero.

In the non-write memory cell and write non-selection memory cell, the potential difference of gate and channel is respectively $V_{pass}$ or $V_{pass}-V_{boost}$ and $V_{pgm}-V_{boost}$, and substantially tunnel current does not flow, and hence the data in the memory cell is held. Herein, the voltage $V_{boost}$ refers to the voltage elevated by capacitive coupling of the potential transferred to the channel of string by source following of the selection gate SGD with the word line. Afterwards, signal $E_{vpass}$ becomes Low level, and the non-selection word line becomes 0V. Further, after lapse of specified time TD, signal $E_{vpgm}$ becomes Low level, and the selection word line becomes 0V. When signal $E_{pgm}$ showing writing action becomes Low level, writing operation is terminated.

Referring to FIGS. 10 and 12, verify read action is described, which is to confirm whether data is written or not into the memory cell to write in.

In the verify action, only the portion different from the ordinary reading action is indicated by dotted line in FIG. 12, and the same operation is indicated by solid line.

As $V_{PRE}$ becomes High level, bit line BLij is precharged. When PRE becomes Low level, the bit line floats. When signal $E_{read}$ becomes High level, and clocks CLK, RCLK begin to operate, the selection word line becomes $V_{vrfy}$ (up to 1V), the non-selection word line, selection gates GSGD, GSGS become $V_{read}$. When the data of the memory cell connected to the selection word line is "1", the potential of the bit line drops, and if "0", the potential of the bit line is kept precharged. If latched at "0" in the immediate preceding write action (latched to issue 0V to bit line), when the data appearing in the bit line is "0" data, LCH1 is High level and the latch is inverted, and in the case of "1" data, even if LCH1 is High level, the latch is not inverted. When the latch is inverted, in the immediate succeeding write action, it is "1" latched state ($V_{CC}$ issued to bit line). If latched at "1" in the immediate preceding write action, there is no effect of LCH1 on the latch.

Thus, when latched at "0" and the verify read action is "1" data, the latch maintains the "0" latch state, and in other combinations, "1" latch is kept. Only after all memory cells to be written have been written, the precharged and floating signal PF maintains high level, so that writing is terminated.

On the other hand, if writing is insufficient even in one cell out of the cells to be written, the node N2 of the latch circuit corresponding to such cell is High level, and transistor MN50 is turned on, and signal PF becomes Low level. When the signal PF is Low level, rewrite action starts. The rewrite action and subsequent verify read action are terminated when the signal PF becomes High level.

The read operation is described by referring to FIGS. 10 and 12. That is, the preset action of the latch circuit is as follows. When BLC becomes Low level, node N1 of all latch circuits is preset at Low level, and node N2 at High level. Later, the bit line is precharged by $V_{PRE}$ to float. When signal $E_{read}$ becomes High level and clocks CLK, RCLK begin to operate, the selection word line becomes 0V, and the non-selection word line and selection gates GSGDE, GSGS are set to $V_{read}$.

When the data of selected memory cell is "1", the potential of the bit line declines, and if "0", on the other hand, the potential of the bit line is kept precharged. The data appearing in the bit line is taken into the latch circuit as LCH1 becomes High level. In the case of "0" data, since the transistor MN32 is turned on, the node N2 is inverted to Low level.

In the case of "1" data, on the other hand, since the transistor MN32 is turned off, the latch is not inverted. The latched data is transferred to the 10 line as the column address signal CAi becomes High level, and is issued outside through the I/O buffer.

Referring then to FIG. 13, the erase operation is specifically described below.

When signal $E_{era}$ showing erase operation becomes High level, the well voltage Well of the memory cell is set to erase voltage $V_{era}$ (up to 20V) by clock ECLK. All word lines of selected blocks are fixed to 0V, and by the potential difference between gate and well, electrons of the floating gate are drawn out into the well to become "1" data. On the other hand, the word line of the memory cell in the non-selection block climbs up close to $V_{era}$ by the capacity ratio to the well due to floating. In these memory cells, since the potential of the gate and well is small, electrons are entrapped within the floating gate, and the data does not change.

Embodiments of the invention realized in the above circuits are described below.

A first embodiment of the invention is described. FIGS. 15A and 15B are timing charts showing the timing for rising of write voltage pulse $V_{pp}$ and transfer voltage pulse $V_{pass}$ in the nonvolatile semiconductor memory device in the first embodiment of the invention. FIG. 15A shows $V_{pp}$ (first pulse), and FIG. 15B relates to $V_{pass}$ (second pulse).

As shown in the charts, in this embodiment, the time of applying transfer voltage pulse $V_{pass}$ (for example, 8V) of the non-selection word line is sufficiently earlier than the time of applying write voltage pulse $V_{pp}$ (for example, 18V) of the selection word line (t1'<t1, and t2'<t2). Moreover, considering fluctuations of pulse among memory cells, supposing the rise time of pulse to be, for example, 5 μs, the difference may be, for example, t1–t1'=3 μs.

Accordingly, the write voltage pulse Vpss does not appear earlier than the transfer voltage pulse $V_{pass}$ and, regardless of the data pattern of memory cell, the fluctuation of the threshold of "1" write memory cell provided with write voltage pulse $V_{pp}$ becomes smaller. Here, the fall timing of the write voltage pulse $V_{pp}$ and transfer voltage pulse $V_{pass}$ is as shown in FIG. 11.

A second embodiment of the invention is described.

FIGS. 16A and 16B are timing charts showing the timing for falling of write voltage pulse $V_{pp}$ and transfer voltage pulse $V_{pass}$ in the nonvolatile semiconductor memory device in the second embodiment of the invention. FIG. 16A shows $V_{pp}$, and FIG. 16B relates to $V_{pass}$.

As shown in the charts, in this embodiment, the time of transfer voltage pulse $V_{pass}$ (for example, 8V) of the non-selection word line beginning to fall sufficiently earlier than the time of write voltage pulse $V_{pp}$ (for example, 18V) of the selection word line beginning to fall (t3'<t3). Moreover, considering fluctuations of pulse among memory cells, supposing the fall time of pulse to be, for example, 5 μs, the difference may be, for example, t3–t3'=3 μs. Accordingly, the write voltage pulse $V_{pass}$ does not fall earlier than the transfer voltage pulse $V_{pass}$ and the fluctuation of the threshold of "1" write memory cell provided with write voltage pulse $V_{pp}$ becomes smaller. Here, the rise timing of the write voltage pulse $V_{pp}$ and transfer voltage pulse $V_{pass}$ is arbitrary.

A third embodiment of the invention is described.

The following explanation also refers to the timing charts in FIGS. 16A and 16B.

As shown in the charts, in this embodiment, the sufficient falling time of transfer voltage pulse $V_{pass}$ (for example, 8V) of the non-selection word line is sufficiently earlier than the sufficient falling time of write voltage pulse $V_{pp}$ (for example, 18V) of the selection word line (t4'<t4). Moreover, considering fluctuations of pulse among memory cells, supposing the fall time of pulse to be, for example, 5 μs, the difference may be, for example, t4–t4'=3 μs.

Accordingly, the write voltage pulse $V_{pp}$ does not fall earlier than the transfer voltage pulse $V_{pass}$, and the fluctuation of the threshold of the "1" write memory cell provided with write voltage pulse $V_{pp}$ becomes smaller. Here, the rise timing of the write voltage pulse $V_{pp}$ and transfer voltage pulse $V_{pass}$ is arbitrary.

A fourth embodiment of the invention is described.

FIGS. 17A and 17B are timing charts of write voltage pulse $V_{pp}$ and transfer voltage pulse $V_{pass}$ in the nonvolatile semiconductor memory device in the fourth embodiment of the invention. This embodiment is a combination of the first and second embodiments, and characteristics with fewer writing errors are obtained. As shown in the charts, the time of applying transfer voltage pulse $V_{pass}$ (for example, 8V) of the non-selection word line is sufficiently earlier than the time of applying write voltage pulse $V_{pp}$ (for example, 18V) of the selection word line (t1'<t1, and t2'<t2). Moreover, considering fluctuations of pulse among memory cells, supposing the rise time of pulse to be, for example, 5 μs, the difference may be, for example, t1–t1'=3 μs.

Moreover, the time of transfer voltage pulse $V_{pass}$ (for example, 8V) of the non-selection word line beginning to fall is sufficiently earlier than the time of the write pulse $V_{pp}$ (for example, 18V) of the selection word line beginning to fall (t3'<t3). Moreover, considering fluctuations of pulse among memory cells, supposing the fall time of pulse to be, for example, 5 μs, the difference may be, for example, t3–t3'=3 μs.

Accordingly, the write voltage pulse $V_{pp}$ does not appear earlier than the transfer voltage pulse $V_{pass}$ and the write voltage pulse $V_{pp}$ does not fall earlier than the transfer voltage pulse $V_{pass}$. Regardless of the data pattern of memory cell, the fluctuation of the threshold of a memory cell written with "1" data provided with write voltage pulse $V_{pp}$ becomes smaller.

A fifth embodiment of the invention is described, also referring to the timing charts in FIGS. 17A and 17B. This embodiment is a combination of the first and third embodiments, and fewer writing errors are obtained. FIG. 17A shows $V_{pp}$, and FIG. 17B relates to $V_{pass}$. As shown in the charts, in this embodiment, the time of applying transfer voltage pulse $V_{pass}$ (for example, 8V) to the non-selection word line is sufficiently earlier than the time of applying write voltage pulse $V_{pp}$ (for example, 18V) to the selection word line (t1'<t1, and t2'<t2). Considering fluctuations of pulse among memory cells, supposing the rise time of pulse to be, for example, 5 μs, the difference may be, for example, t1–t1'=3 μs.

Moreover, the sufficient falling time of transfer voltage pulse $V_{pass}$ (for example, 8V) of the non-selection word line is sufficiently earlier than the sufficient falling time of write voltage pulse $V_{pp}$ (for example, 18V) of the selection word line (t4'<t4). Considering fluctuations of pulse among memory cells and supposing the fall time of pulse to be, for example, 5 μs, the difference may be, for example, t4–t4'=3 μs.

Accordingly, the write voltage pulse $V_{pp}$ does not appear earlier than the transfer voltage pulse $V_{pass}$, and the write voltage pulse $V_{pp}$ does not fall earlier than the transfer voltage pulse $V_{pass}$. Regardless of the data pattern stored in the memory cell, the fluctuation of the threshold of "1" data written into a memory cell provided with write voltage pulse $V_{pp}$ becomes smaller.

As described herein, according to the nonvolatile semiconductor memory device of the invention, various effects are obtained as shown in FIG. 18. In FIG. 18, symbol A' represents the characteristic of cell A in the prior art, A shows the characteristic of a cell A operating according to the method of the invention, and $V_{th}$ indicates the boundary of "0" data and "1" data.

According to a self-boost writing method in accordance with the invention, since the pulse $V_{pass}$ begins to fall earlier than the pulse $V_{pp}$ begins to fall, or the time when the pulse $V_{pp}$ reaches its minimum value is earlier than the time when the pulse $V_{pass}$ reaches its minimum value, the fluctuation of the threshold is extremely small for the write inhibited memory cell connected to the selection word line to which the pulse $V_{pp}$ for writing "1" is applied.

In this case, outstanding effects are obtained without depending as much on the rise timing of the pulses $V_{pp}$ and $V_{pass}$. The effects are sufficient when the memory cells connected to the bit lines all contain "1" data so that the channel is in a floating statefor the memory cells closer to the bit line than the selection word line that is provided with the pulse $V_{pp}$. The effects are smaller if "0" data are in any of these memory cells.

Therefore, a sequential writing method from the source side, without allowing random programming, is preferred. If random programming is permitted, however, since fluctuation of the threshold in writing from the source side is usually small, it is likely that writing errors will improve considerably.

This effect is, in the case of writing from the source side, the greatest when the data is "0" in all memory cells on the source line side rather than the selection word side of the memory cells connected to the write non-selection bit line in which the channel is floating. This pattern is most likely to cause writing errors in conditions other than random programming. Therefore, considering the large scale memory cell array, a notable improvement of chip writing error characteristic is obtained, and if writing errors are avoided, the fluctuation of the threshold voltage of "1" data is smaller, providing a significant improvement in the read disturb (fluctuation of threshold when reading) or retention (fluctuation of threshold in room temperature standing) characteristic.

Secondly, according to the invention, since the pulse $V_{pass}$ begins to rise earlier than the pulse $V_{pp}$ begins to rise, or the time when the pulse $V_{pp}$ reaches the maximum value earlier than the time when the pulse $V_{pass}$ reaches the maximum value, the writing error characteristic can be improved regardless of the data pattern of memory cells.

This effect is particularly significant when the data of the memory cells connected to the write non-selection bit line in which the channel is floating is "1" data and its threshold is greater in the negative direction. Suppose the data is "0" in all memory cells connected to the non-selection word lines other than the selection word lines provided with pulse $V_{pp}$. When the pulse $V_{pp}$ is given to the selection word line, if the pulse $V_{pass}$ is 0V (when the pulse $V_{pp}$ rises earlier), the memory cells other than the non-selection memory cell of "1" write connected to the selection word lines and write non-selection bit lines are cut off, and the "1" write memory cells are in a local self-boosted state, so that the threshold hardly fluctuates.

On the other hand, when the number of pieces of "0" data decrease from this case, the number of memory cells to be cut off is decreased, and hence the threshold fluctuation increases. Moreover, when data is "1" in all memory cells, the local selfboosted state is established or not depending on the value of the threshold. This is true even in the case of "1" data. When the threshold is not so large in the negative direction, the memory cell is cut off, but if the threshold is large in the negative direction, it is not cut off. Thus, the fluctuation of the threshold increases.Such fluctuations of the threshold occur when the potential difference of the channel and selection word line is great because the pulse $V_{pp}$ is given to the selection word line before rise of pulse $V_{pass}$, that is, before the floating channel is lifter by the pulse $V_{pass}$. Therefore, when the pulse $V_{pass}$ rises sufficiently before the pulse $V_{pass}$ rises sufficiently before the pulse $V_{pp}$ rises, threshold fluctuation and wrong writing can be decreased regardless of the data pattern.

By combining the first and second effects according to the invention, in "1" writing (writing of the selection word line and channel provided with pulse $V_{pp}$ into the memory cells connected to the write non-selection bit line with floating channel), threshold fluctuations and writing errors can be improved significantly.

This discussion has explained the advantages of the present methods and devices in reducing threshold fluctuation and writing errors in the non-selection memory cells for writing "1" data connected to selection word lines provided with pulse $V_{pp}$ and write non-selection bit lines with floating channel. Consequently, these methods and devices are also effective for notably improving the threshold fluctuation and writing errors for the non-selection memory cells for holding the data connected to the bit lines to which 0V is transferred and the non-selection word lines are provided with pulse $V_{pass}$.

That is, by the first and second effects, it is not required to increase the pulse $V_{pass}$ as much. Therefore, in the non-selection memory cells provided with 0V in the bit lines and pulse $V_{pass}$ in the word lines so that the pulse $V_{pass}$ could cause writing errors, the pulse $V_{pass}$ is small so that threshold fluctuation and writing errors are reduced. Accordingly, the fluctuation of "1" data and writing errors into "0" data are substantially improved and, in particular, the reliability of memory cells of greater size is enhanced. Moreover, in the presence of threshold fluctuation, reading after writing (read disturb) and margin in ordinary temperature and high temperature standing (retention) are decreased and the reliability deteriorates, but enhancement of data holding time of the memory cells is expected in this invention.

As described herein, the invention presents a nonvolatile semiconductor memory device and data writing control method extremely improved in avoiding writing errors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
   a memory cell array having cell strings each of which is constituted of a plurality of memory cells connected in series, each of said memory cells having at least a control gate; and
   a control circuit that, at a time of programming, applies a write voltage pulse to the control gate of a memory cell selected from the plurality of memory cells constituting the cell strings, and that, at the time of programming, applies a transfer voltage pulse to non-selected memory cells,
   wherein said control circuit changes a signal level of the transfer voltage pulse prior to the change in a signal level of the write voltage pulse and wherein said control circuit controls the timings of the write voltage pulse and the transfer voltage pulse in such a manner that the transfer voltage pulse falls when the write voltage pulse is at a high level.

2. The non-volatile semiconductor memory device according to claim 1, wherein the write voltage pulse is generated on the basis of a first signal, the transfer voltae pulse is generated on the basis of a second signal, and said non-volatile semiconductor memory device further comprises a delay circuit for delaying the first signal with respect to the second signal.

3. The non-volatile semiconductor memory device according to claim 2, wherein the delay circuit includes a delay element, an input terminal and an output terminal, the second signal is input into the input terminal, the first signal is output from the output terminal, and the first signal is delayed with respect to the second signal for a period of time which corresponds to a delay time of the delay element.

4. The non-volatile semiconductor memory device according to claim 2, further comprising a first circuit for outputting the first signal and a second circuit for outputting the second signal when a third signal is input into the first circuit and the second circuit.

5. The non-volatile semiconductor memory device according to claim 4, wherein the first circuit includes a delay element which delays the third signal, and the first signal is generated on the basis of a signal delayed for a period of time which corresponds to a delay time of the delay element.

6. The non-volatile semiconductor memory device according to claim 2, wherein the first and second signals are generated by a binary counter which receives an input clock and outputs a plurality of clocks and a logic circuit which outputs a result of logic calculation for the plurality of clocks.

7. The non-volatile semiconductor memory device according to claim 1, wherein the control circuit controls the timings of the write voltage pulse and the tansfer voltage pulse in such a manner that a beginning of a fall time of the write voltage pulse is set later than a beginning of a fall time of the transfer voltage pulse.

8. The non-volatile semiconductor memory device according to claim 1, wherein the control circuit controls the timings of the write voltage pulse and the transfer voltage pulse in such a manner that an end of a fall time of the write voltage pulse is set later than an end of a fall time of the transfer voltage pulse.

9. A non-volatile semiconductor memory device comprising:
  a memory cell array having cell strings arranged in a matrix form, each of said cell strings constituted of a plurality of memory cells which include control gates, sources and drains and are connected in series in such a manner that adjacent ones of the memory cells share one source and one drain;
  a plurality of bit lines connected to one end of each of the cell strings and arranged in a column direction of the memory cell array;
  a source line connected to the other end of each of the cell strings; and
  a control circuit that, at a time of programming, applies a write voltage pulse to the control gate of memory cell selected from the plurality of memory cells constituting the cell strings, and that, at the time of programming, applies a transfer voltage pulse to non-selected memory cells,
  wherein said control circuit changes a signal level of the transfer voltage pulse prior to the change in a sismal level of the write voltage pulse and wherein said control circuit controls the timings of the write voltage pulse and the transfer voltage pulse in such a manner that the transfer voltage pulse falls when the write voltage pulse is at a high level.

10. The non-volatile semiconductor memory device according to claim 9, wherein said control circuit controls the timings of the write voltage pulse and the transfer voltage pulse in such a manner that an end of a fall time of the transfer voltage pulse is set earlier than an end of a fall time of the write voltage pulse.

* * * * *